United States Patent
Staines et al.

(10) Patent No.: US 6,822,394 B2
(45) Date of Patent: Nov. 23, 2004

(54) MICROWAVE GENERATOR

(75) Inventors: Geoffrey Staines, Röthenbach (DE); Josef Dommer, Nürnberg (DE); Frank Sonnemann, Nürnberg (DE); Jürgen Bohl, Eckenhaid (DE); Tilo Ehlen, Nürnberg (DE)

(73) Assignee: Diehl Munitionssysteme GmbH & Co. KG, Rothenbach (DE)

( * ) Notice: Subject to any disclaimer, the term of this patent is extended or adjusted under 35 U.S.C. 154(b) by 133 days.

(21) Appl. No.: 10/267,469

(22) Filed: Oct. 9, 2002

(65) Prior Publication Data

US 2003/0076044 A1 Apr. 24, 2003

(30) Foreign Application Priority Data

Oct. 23, 2001 (DE) .......................................... 101 51 565

(51) Int. Cl.⁷ ............................................... H01T 13/00
(52) U.S. Cl. ........................................ 315/39; 333/222
(58) Field of Search ............................ 315/39; 333/222, 333/20

(56) References Cited

U.S. PATENT DOCUMENTS

| | | | |
|---|---|---|---|
| 3,748,528 A | 7/1973 | Cronson | |
| 4,104,558 A | 8/1978 | Proud, Jr. et al. | |
| 4,760,311 A | 7/1988 | Wootton | |
| 4,845,378 A | 7/1989 | Garbe et al. | |
| 4,875,022 A | 10/1989 | Berry et al. | |
| 4,905,673 A | 3/1990 | Pimiskern | |
| 5,142,194 A | 8/1992 | Jacubeit et al. | |
| 5,835,545 A | 11/1998 | Turchi | |

FOREIGN PATENT DOCUMENTS

| | | |
|---|---|---|
| DE | 35 28 338 C1 | 8/1985 |
| DE | 101 51 565 A1 | 10/2001 |

OTHER PUBLICATIONS

K. Hong, et al., "Development of Antenna–Source System For Generation of High–Power Electromagnetic Pulses", PPPS–2001—Pulsed Power Plasma Science 2001; Las Vegas, NV, Jun. 17, 2001; pp. 203–206.

*Primary Examiner*—David Vu
(74) *Attorney, Agent, or Firm*—Scully, Scott, Murphy & Presser

(57) ABSTRACT

For a compact microwave generator (11) with powerfully wide-band microwave radiation in which there is a marked resonance increase whose frequency center of gravity is variable in order to be able to adapt the power center in respect of the radiated wavelengths to the geometrical structure of a circuit configuration to be disturbed, a conductor (29) which coaxially surrounds the spark gap (13) between the electrodes (14–15) is electrically connected to one of the two electrodes (15) mechanically adjustably in its effective length as a variable resonator.

14 Claims, 1 Drawing Sheet

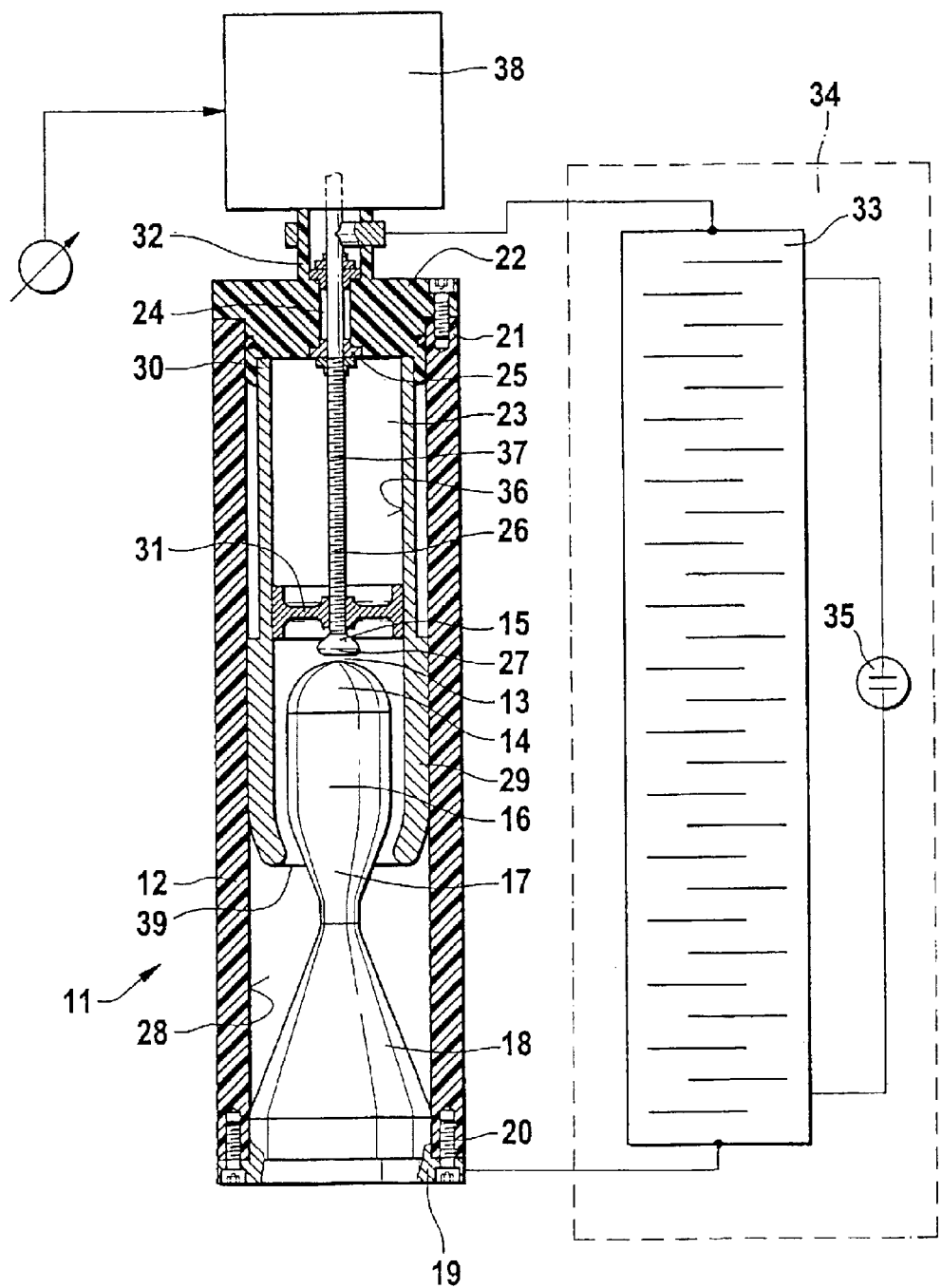

MICROWAVE GENERATOR

BACKGROUND OF THE INVENTION

1. Field of the Invention

The invention concerns a microwave generator with a high spark gap between colinearly arranged electrodes.

The function of such a generator is based on the fact that a high voltage battery, for example a capacitor battery which is charged up in parallel on the basis of the principle of the Marx impulse voltage circuit and then connected in series, is discharged by way of a spark gap which is set between the electrodes, across which the high voltage of the series circuit is then applied. Such a discharge process results in a flow of current which starts steeply and oscillates severely, in the electrodes and in antenna conductors which are possibly additionally electrically conductively connected thereto, and it thus results in correspondingly wide-band irradiation of a microwave spectrum of high energy density, which in the environment of such a microwave generator can at least adversely affect radio communications and disturb or even destroy electronic circuits in particular at the input side.

2. Discussion of the Prior Art

That effect of intensive microwave irradiation is therefore propagated as a non-lethal weapon against hostile communication systems (see DER SPIEGEL, issue July 1997, pages 53 ff, end of paragraph 3 in the left-hand column on page 54).

SUMMARY OF THE INVENTION

The object is attained by the essential features of the invention in that on both sides of the spark gap, the electrodes and coaxial holders thereof are accompanied at least over a part of their axial lengthwise extension by an electrical conductor which extends in spaced relationship therewith and which is electrically conductively connected to one of the electrodes.

In accordance with the present invention, two electrodes are disposed in mutually opposite axially spaced relationship to define a spark gap coaxially in the interior of a tubular housing at a radial distance relative to the inside wall. That pair of electrodes represents a capacitor in which high voltage energy is stored until the abrupt energy discharge occurs as a result of flash-over across the spark gap. For charging up that capacitor, each of the two electrodes is held insulated at an end of the housing and is electrically connected to a high voltage generator. This preferably involves a Marx impulse voltage circuit of small size, whose capacitor battery is charged up statically from a direct current source or dynamically from an electromechanical pulse generator in a parallel circuit, before it is switched over into a series relationship, the correspondingly multiplied voltage of which is applied to the pair of electrodes of the above-mentioned spark gap and results in firing thereof.

In addition, arranged in the interior of the housing radially spaced with respect to the spark electrodes and in parallel relationship therewith is at least one hollow-cylindrical conductor which preferably also extends axially, beyond the electrodes, over at least a part of the electrode holders. This conductor which serves as a tuneable resonator antenna is connected for resonance detuning over the very wide range of at least approximately one octave, at a location which is longitudinally variable to one of the two electrode holders. As a consequence of that arrangement, the conductor acts as a variably frequency-determining member which at the same time increases the length of pulses as desired as a result of transit time effects. This occurs for the current oscillations which are triggered by the high voltage discharge across the spark gap with a steep current rise edge and which therefore radiate vigorously and which involve a variable frequency point of concentration. In the high radiated interference energy which is proportional to the pulse length, that permits specific and targeted adaptation of the centre region of the effective wavelengths. The wavelengths can be targeted approximately to the spatial dimensions of the conductor path geometry in the input circuit of a respective given type of computers or communication devices in order there to achieve overmodulation effects or even joulean destruction effects as a consequence of an excessive resonance increase in the microwave voltage which is coupled thereto. Accordingly this system according to the invention, as a high-energy pulse interference or jamming device which can be optimized in terms of frequency, is more effective by orders of magnitude than the conventional production of CW interference energy in the form of damped sinusoidal oscillations. On the other hand, by virtue of the wide-band nature of the interference generator according to the invention, adaptation of an interference frequency to the electromechanical dimensions of the system to be interfered with is not precisely required.

BRIEF DESCRIPTION OF THE ACCOMPANYING DRAWING

For the purposes of a more detailed discussion of the invention and the options afforded thereby and in regard to further advantages and modifications of the above-described structure attention is directed to the further claims and to the description hereinafter of the drawing.

The single FIGURE of the drawing is an axial longitudinal sectional view of a preferred embodiment of the structure according to the invention, in greatly abstracted form, being limited to what is functionally essential, but shown diagrammatically approximately true to scale.

DETAILED DESCRIPTION OF A PREFERRED EMBODIMENT

The microwave generator 11 which is shown in a view in longitudinal section has at the centre of a hollow-cylindrical housing 12 a spark gap 13 between an electrode 14 of relatively large diameter, which is in the form of a spherical cap, and an electrode 15 which is of substantially smaller diameter than same and which is displaced axially with respect thereto in coaxial relationship and which is rounded off in a mushroom shape at its front end and which elsewhere is of a flat-cylindrical configuration. The first-mentioned electrode 14 forms a convex end of an electrode holder 16 which in other respects is cylindrically bottle-shaped and whose neck-shaped tapered portion 17 adjoins the small base of a truncated cone 18 with a pointed tip. In front of its large base which engages coaxially into the internal space 23 of the housing 12, the truncated cone 18 carries a flange 19 which extends therearound in a disc configuration and which is held axially in front of the adjacent end 20 of the housing 12.

Projecting into the opposite end 21 of the housing 12 is a plug 22 which is also supported axially in front of same. In a central through hole 24 the plug 22 has a plain bearing bushing 25 for an electrode holding bar 26 which is fixed axially thereto and to the opposite end 27 of which the smaller electrode 15 is coaxially fixed.

In this embodiment, at least one electrical conductor 29 which is held in insulated relationship on the inside wall 28 of the housing 12 extends between the tapered portion 17 of the electrode holder 16 and the oppositely disposed electrode holder in the form of the plug 22 with the holding bar 26. The hollow cylindrical wall of the housing 12 and the plug 22 preferably comprise insulating material which is electrically resistant to flash-over so that the conductor 29 is not itself to be provided with insulation which is resistant to high voltage. The conductor 29 can be in the form of a bar in parallel relationship with the axis, a cage-shaped plurality of bars, a mesh latticework or, as diagrammatically illustrated, a hollow metal cylinder. Preferably the conductor 29 is fixed in force-locking relationship to the inside wall 28 of the housing 12 only in the vicinity of the large electrode holder 16 while the remaining portion of the conductor 29, which extends along the holding bar 26, is spaced radially with respect to the inside wall 28 of the housing and is then held radially—and also axially—only at its axial end 30 in the plug 22. The conductor 29 is electrically connected by way of a radial bridge 31 to the holding bar 26 and by way of same therefore to the small electrode 15.

The electrode holding bar 26 projects through the plug 22 into a connecting portion 32, by way of which the small electrode 15 can be connected to a terminal of a capacitor battery 33 of a Marx impulse voltage circuit 34 whose oppositely disposed terminal is then electrically conductively connected as illustrated by way of the flange 19 to the large electrode 14. In such an impulse voltage circuit 34 the capacitors of the battery 33, which are only symbolically indicated in the drawing, are charged up from a continuously or pulse-like operating dc voltage source 35 in parallel, in order then to switch them over to a series arrangement and thereby correspondingly multiply the output voltage of the capacitor battery 33. That high voltage is applied across the electrodes 14–15 and therefore charges up the capacitance between them and finally fires between them a spark gap 13, by way of which that capacitance is discharged with a current pulse which is initiated with a steep edge. That discharging current pulse which flows through the electrodes 14–15 involves vigorous oscillations which in the conductor 29 connected to that discharging current circuit also result in current oscillations whose frequency mix experiences an excessive resonance increase in accordance with the instantaneous electrically effective mechanical length dimensions of the conductor 29, comparable to high frequency-engineering cavity resonator dimensioning or dipole dimensioning.

The strong current oscillations of the order of magnitude of approximately one kA, which are triggered by the discharge of the high voltage energy which is put into intermediate storage at more than 600 kV across the electrodes 14–15 in typically about 20 pF result in the irradiation of a correspondingly intensive electromagnetic microwave field which oscillates in wider-band fashion as a result of the single-pole conductor 29 tuneably connected to an electrode 15, with reduced amplitudes, and also provided therein with a marked resonance increase. The process is respectively repeated in accordance with the charging cycle of the capacitance across the electrodes 14–15, which cycle is primarily predetermined by the dimensioning of the high voltage circuit 34, and as a result can give rise to a quasi-continuous wide-band interference radiation with a variable centre frequency. Such a microwave generator can be produced in a compact size and therefore can be put to versatile use in particular as an interference or jamming device which is highly effective and simple to handle or arrange, in relation to the functioning of electronic circuits, as it is easily possible to sweep through the operative spectrum in operation by way of the spindle 37 or the operative spectrum can be tuned directly to resonance with the circuit geometry to be interfered with.

The frequency range of the resonance increase can therefore be easily varied within wide limits by virtue of the fact that the bridge 31 between the electrode holding bar 26 and the conductor 29 is displaceable in the longitudinal direction of the housing 12, in particular it is as shown in the form of an axially adjustable short-circuiting disc between the inside peripheral surface 36 of a hollow-cylindrical conductor and the electrode holding bar 26. To provide for that axial displacement, the electrode holding bar 26 which is held in an axially fixed condition in the interests of a constant length of the spark gap 13 is provided with spindle pitches 37 on its surface and the holding bar 26 itself (together with its electrode 15) is rotatably held in an axially arrested condition in the plug 22. Tuning of the resonance increase in the wide-band microwave radiation is thus effected by shortening or lengthening the electrically operative dimension of the conductor 29 connected to the one electrode 15, by means of electrical displacement of the short-circuit bridge 31 on the spindle pitches 37, the bridge 31 being disc-shaped as diagrammatically illustrated in the drawing and being guided in such a way that it is arrested to prevent it from also rotating. Rotation of the spindle pitch 37 for displacement of the bridge 31 can be effected manually behind the connecting portion 32; or, as illustrated in the drawing, such actuation can be effected by means of a control motor 38 which is flange-mounted there and which is for example battery-operated and the rotor of which is non-rotatably coupled directly or by way of a transmission to the end of its holding bar 26, which is opposite to the electrode 15.

The free end edge 39 of the conductor 29, in particular when it is in the form of a hollow cylinder, is preferably inclined as diagrammatically shown along the field configuration towards the tapered portion 17 of the holder. A rounded configuration at the end—as at the free end faces of the electrodes 14–15—affords additional geometrical adaptation of the metal surfaces to the electrical field configuration and thereby avoids the occurrence of local excessive field increases which could already trigger off parasitic flash-overs before firing of the spark gap 13.

In the interests on the one hand of a flash-over across the spark gap 13, which occurs only at a high voltage and with a suitably steep current edge, and in the interests on the other hand of a low speed of arc transfer between the electrodes 14–15, which desirably results in a system which oscillates in an extended manner at many smaller amplitudes and therefore irradiates more energy, the surroundings of the flash-over gap, that is to say the internal space 23 of the housing 12, are preferably filled with a fluid which is a good electrical insulator and which is of the highest possible dielectric constant and which can easily involve distilled water. Because of the overvoltage-proofness that permits the housing 12 to be of a small compact size and in addition by virtue of its thermal capacity this has the advantage that, when the high voltage dies away, the flash-over across the spark gap 13 is relatively abruptly terminated again and thus in the interests of once again strong oscillation the discharging current is also caused to have a steep rear edge.

The invention therefore affords a compact microwave generator 11 with powerfully wide-band microwave radiation in which there is a marked resonance increase whose center frequency variable by a mechanical adjustment in order to be able easily to adapt the power centre in respect of the radiated wavelengths. The wavelengths are adapted to the geometrical structure of a circuit configuration to be disturbed, in that a conductor 29 of variable length which coaxially surrounds the spark gap 13 between the electrodes 14–15 is electrically connected as a mechanically adjustable resonator to one of the two electrodes (15).

What is claimed is:

1. A microwave generator (11) with a high voltage spark gap (13) between colinearly arranged first and second electrodes (14–15) characterized in that on both sides of the spark gap (13) the electrodes (14–15) and coaxial electrode holders (16, 26) are accompanied at least over a part of their axial lengthwise extension by an electrical conductor (29) which extends in spaced relationship therewith and which is electrically conductively connected to one of the electrodes (14, 15).

2. A microwave generator according to claim 1, characterised in that said first and second electrodes (14, 15) are of different diameters with rounded end faces facing towards each other and are held in a fixed mutual axial position on a longitudinal axis of a hollow-cylindrical housing (12).

3. A microwave generator according to claim 1, characterised in that said first electrode (14) comprises a convex end cap of a cylindrical electrode holder which in axially opposite relationship has a tapered portion (17) in the shape of a bottle neck.

4. A microwave generator according to claim 3, characterised in that the tapered portion (17) of the cylindrical electrode holder is connected to a truncated cone (18) which is held with a peripherally extending flange (19) axially in an end (20) of a hollow-cylindrical housing (12).

5. A microwave generator according to claim 2 or 4, characterised in that said second electrode (15) is arranged at one end of an electrode holding bar (26) whose other end is held axially fixed in an end (21) of the hollow-cylindrical housing (12).

6. A microwave generator according to claim 1, characterised in that the housing (12) in at least an area around the electrical conductor (29) comprises an electrically insulating material.

7. A microwave generator according to claim 2 or 4, characterised in that the electrical conductor (29) is held to an inside wall (28) of the housing (12) along a region adjacent to the electrode holder (16) of the first electrode (14).

8. A microwave generator according to claim 7, characterised in that the electrical conductor (29) is held radially spaced in relation to the inside wall (28) of the housing (12) along a region adjacent to the electrode holder (26) of the second electrode (15).

9. A microwave generator according to claim 2 or 4, characterised in that a said electrical conductor (29) is a hollow cylindrical conductor, and is held axially and radially to the housing (12) with an end of the electrical conductor remote from the electrodes (15, 14).

10. A microwave generator according to claim 5, characterised in that the electrode holding bar (26) and the second electrode (15) and the electrode holder (16) and the first electrode (14) are surrounded by the electrical conductor which comprises a hollow-cylindrical conductor (29) of variable length as an adjustable resonator.

11. A microwave generator according to claim 2 or 4, characterised in that a bridge (31) extending radially in the housing (12) between the electrical conductor (29) and one of the electrode holders (26) is longitudinally displaceably guided in the housing (12).

12. A microwave generator according to claim 5, characterised in that a bridge (31) extending radially in the housing (12) is fixed as a short-circuiting disc non-rotatably mounted on a spindle pitch (37) of the electrode holding bar (26) which is axially fixedly mounted rotatably at an end (21) of the housing (12).

13. A microwave generator according to claim 12, characterised in that the electrode holding bar (26) is rotatable by a control motor (38).

14. A microwave generator according to claim 1, characterised in that the first and second electrodes (14–15) are connected to a capacitor battery (33) of an impulse voltage circuit (34).

* * * * *